(12) United States Patent
Ivanov et al.

(10) Patent No.: US 7,768,351 B2
(45) Date of Patent: Aug. 3, 2010

(54) VARIABLE GAIN CURRENT INPUT AMPLIFIER AND METHOD

(75) Inventors: Vadim V. Ivanov, Tucson, AZ (US); Keith E. Kunz, Bryan, TX (US); Sachin Rao Bandigadi, Udupi District (IN); Prasadu Naga Venkata Mangina, Palkol (IN)

(73) Assignee: Texas Instruments Incorporated, Dallas, TX (US)

( * ) Notice: Subject to any disclaimer, the term of this patent is extended or adjusted under 35 U.S.C. 154(b) by 118 days.

(21) Appl. No.: 12/215,186

(22) Filed: Jun. 25, 2008

(65) Prior Publication Data

US 2009/0322429 A1    Dec. 31, 2009

(51) Int. Cl.
*H03F 3/45*    (2006.01)
(52) U.S. Cl. ..................................... 330/255
(58) Field of Classification Search ................ 330/253, 330/254, 255, 257, 288; 323/315, 316
See application file for complete search history.

(56) References Cited

U.S. PATENT DOCUMENTS 6,100,762 A * 8/2000 Kato ........................ 330/255
6,437,645 B1   8/2002 Ivanov et al. ............... 330/255

* cited by examiner

*Primary Examiner*—Robert Pascal
*Assistant Examiner*—Khiem D Nguyen
(74) *Attorney, Agent, or Firm*—John J. Patti; Wade J. Brady, III; Frederick J. Telecky, Jr.

(57) ABSTRACT

Variable gain circuitry includes a first input transistor (M1) having a source coupled to a first conductor (32), a gate coupled to a first input voltage (Vin+), and a drain coupled to a second conductor (30). An input of a first current mirror (M3,M4) is coupled to the second conductor to receive a current corresponding to the difference between the first input voltage and a second input voltage (Vin−). An output of the first current mirror is coupled to a source of current (M2). A first transistor (M5) has a gate coupled to a third conductor (31), a source coupled to a reference voltage ($V_{SS}$), and a drain coupled to conduct output current (Iout). A second transistor (M6) and a resistive element (M7) are coupled in series between the third conductor and the first reference voltage ($V_{SS}$), a gate of the second transistor being coupled to the third conductor to produce a nonlinear relationship between currents of the first transistor and the second transistor.

20 Claims, 9 Drawing Sheets

VARIABLE GAIN CURRENT INPUT AMPLIFIER AND METHOD

BACKGROUND OF THE INVENTION

The present invention relates generally to variable gain amplifiers which are useful in various applications, especially as slew boost circuits for high slew rate operational amplifiers, and also in high bandwidth LDO voltage regulators that require improved transient response to instant increases (i.e. step increases) in demanded load current without use of large, external load bypass capacitors, particularly low-dropout voltage regulators (LDO voltage regulators) which are especially suited to being embedded in various integrated circuit chips that require precise internal load voltage regulation.

The closest prior art related to operational amplifiers having high slew rates is believed to include commonly owned U.S. Pat. No. 6,437,645 entitled "Slew Rate Boost Circuitry and Method" issued to Ivanov et al. on Aug. 20, 2002. A main shortcoming of this prior art is that the common-mode input voltage can not go closer than 2 gate-to-source voltages (2 $V_{GS}$ voltages) to the positive supply rail in a PMOS input stage.

The amount of load current demanded from a voltage regulator by some digital integrated circuits (especially by some digital integrated circuits that include digital logic circuit cells fabricated using various state-of-the-art modern integrated circuit manufacturing processes) can change instantly, i.e., within a few picoseconds, between zero and a large maximum value, e.g. 5 to 150 milliamperes while at the same time very precise power supply voltage regulation is required for the digital logic circuit cells.

Unfortunately, current consumption of some state-of-the-art digital logic circuit cells with advanced power savings features that are fabricated using state-of-the-art processes can instantly (i.e., within a few picoseconds) vary from zero to a high maximum value. Furthermore, very precise supply voltage regulation for these digital cells is required. Existing circuit topologies of LDO voltage regulators do not provide sufficiently fast transient response to supply the required load current steps, i.e., they are not capable of supplying such fast load current steps without the assistance of large load bypass capacitors. Existing topologies of LDO voltage regulator circuits do not allow sufficiently fast transient response to supply such large instantaneous increases (i.e., steps) in the amount of demanded load current without using large external load bypass capacitors that have large capacitances (in the microfarad range) connected between the output of the LDO voltage regulator and a ground supply voltage.

As a practical matter, such large load bypass capacitors can not be included in an integrated circuit chip. Although small load bypass capacitors having capacitances of up to a few nanofarads have indeed been included in digital logic circuit cells, such small load bypass capacitors are incapable of supplying large load instantaneous current steps and maintaining the precise voltage regulation needed by the digital logic circuit cells. Use of large external load bypass capacitors adds substantial cost, including the cost of the capacitors themselves, the cost of extra package pins, and the cost of the die area of the required associated bonding pads.

But most important, the large external load bypass capacitor is separated from the load by a signal bus and by its associated wirebond connection which has a parasitic inductance in 3-5 nanohenry range. The amount of voltage drop across the parasitic inductance during a large load current step exceeds the load voltage regulation requirements of the above-mentioned digital logic cells. This can make reliable operation of the digital logic cells nearly impossible.

The closest prior art related to LDO voltage regulators is believed to include the LDO voltage regulator shown in FIG. 3 of commonly owned U.S. Pat. No. 6,930,551 "Zero Voltage Class AB Minimal Delay Output Stage and Method" issued Aug. 16, 2005 to Ivanov et al. Prior Art FIG. 1 herein shows a schematic diagram of an LDO voltage regulator essentially similar to the one in FIG. 3 of the '551 patent. That LDO voltage regulator includes an input stage the output of which is connected through a source follower transistor to the output Vout. The source follower transistor has a current gain boost loop which increases its output conductance and load capacitance drive capability. The LDO voltage regulator circuitry provides large achievable small-signal bandwidth for a specified amount of current consumption and in a particular integrated circuit manufacturing process, but can not provide the fast large-signal load step response from loads the size of which range from very small load currents to very large load currents.

The present invention is related to the subject matter of the commonly assigned pending patent application, Ser. No. 12/008,533, entitled "LOW DROP VOLTAGE REGULATOR WITH INSTANT LOAD REGULATION AND METHOD", filed by Ivanov et al. on Jan. 11, 2008, and incorporated herein by reference.

In Prior Art FIG. 1, LDO regulator 1 includes a differential input amplifier stage including differentially coupled N-channel input transistors MN1 and MN2. The gate of transistor MN1 is connected to a reference voltage Vref that can be generated by a conventional bandgap circuit. The gate of transistor MN2 is connected to a conductor 6, on which the regulated output voltage Vout of LDO voltage regulator 1 is produced by means of an output stage including P-channel pass transistor MP3 and a N-channel pull-down transistor MN4, a P-channel source follower transistor MP4, and a N-channel cascode transistor MN3. The drain of input transistor MN2 is connected by conductor 3 to the gate of source follower transistor MP4 and to a terminal of a small internal capacitor C0, which provides compensation for the feedback loop that includes input transistor MN1 and source follower transistor MP4. The source and bulk electrodes of source follower transistor MP4 are connected to output conductor 6, which also is connected to the sources of P-channel active load transistors MP1 and MP2 of the differential input stage. The drain of source follower transistor MP4 is connected by conductor 8 to the gate of pull-down transistor MN4. A constant current source 11 producing a current I1 is coupled between $V_{SS}$ and the source of cascode transistor MN3, the drain of which is coupled by conductor 12 to the gate of pass transistor MP3 and one terminal of a pull-up resistor R, the other terminal of which is connected to $V_{DD}$. The gate of cascode transistor MN3 is connected by conductor 18 to the (+) terminal of a constant voltage source 9, the (−) terminal of which is connected to $V_{SS}$. Source follower transistor MP4 is part of a current gain boost feedback loop which in effect increases the output conductance of source follower transistor MP4 and increases the load drive capability of LDO regulator 1. A load 7 is connected between Vout and $V_{SS}$. One terminal of external load bypass capacitor $C_{EXT}$ is coupled by a wire bond to regulated output voltage conductor 6. The wire bond can be represented by its 3-5 nanohenry inductance Lwb. The other terminal of external load bypass capacitor $C_{EXT}$ is also connected by means of a similar wire bond inductance to the $V_{SS}$ conductor on the integrated circuit chip.

Load 7 can be represented by a variable current source $I_L$ connected in parallel with a small internal load capacitance $C_{INT}$.

The circuit structure of prior art LDO voltage regulator 1 provides a large achievable small-signal bandwidth for a chosen total current consumption and a chosen integrated circuit manufacturing process, but can not provide a suitably fast large-signal response to a step increase in the current demanded by load 7 connected to the regulated output voltage Vout on conductor 6. This is because the gate voltage of pass transistor MP3, which typically is a very large device having a gate capacitance of roughly 0.5 to 10 picofarads, may need to swing from few hundred millivolts to more than a volt in response to a step increase in the current demanded by load 7, whereas the current available to charge the gate of the pass transistor MP3 during the load current step is limited by the amount of current I1 that can be supplied by current source 11 alone.

To adequately respond to such a large instantaneous load current step, the gate voltage of pass transistor MP3 in Prior Art FIG. 1 has to swing from at least a few hundred millivolts or to as much as a volt or more. The current available to charge the large gate capacitance of pass transistor MP3 during the instantaneous load current step is limited by the value of the current I1. Consequently, for fast load response, I1 has to be chosen disproportionally large in order to provide the large slewing current demanded by the load.

Consequently, the amount of current I1 of current source 11 must be substantially increased in order to achieve a correspondingly faster response of LDO voltage regulator 1 to a step increase in the demanded load current, thereby undesirably increasing the power consumption of prior art LDO voltage regulator 1.

The LDO voltage regulator of FIG. 2, which is taken from the foregoing patent application, partially solves the foregoing problems but was found to have stability problems.

Thus, there is an unmet need for LDO voltage regulator circuitry which can provide substantially increased voltage regulator bandwidth and large slewing current without stability problems without correspondingly increased power consumption and also without stability problems.

There also is an unmet need for LDO voltage regulator circuitry which can provide a very fast, large-swing drive signal to the gate of an output transistor of the LDO voltage regulator in response to a step-current increase in the current demanded by a load to thereby provide a large slewing current without substantially increasing the quiescent current of the voltage regulator and without causing stability problems.

There also is an unmet need for an improved, more easily implementable operational amplifier having a high slew rate.

SUMMARY OF THE INVENTION

It is an object of the invention to provide LDO voltage regulator circuitry which can provide substantially increased voltage regulator bandwidth and large slewing current without stability problems without correspondingly increased power consumption and also without stability problems.

It is another object of the invention to provide LDO voltage regulator circuitry which can provide a very fast, large-swing drive signal to the gate of an output transistor of the LDO voltage regulator circuitry in response to a step-current increase in the current demanded by a load to thereby provide a large slewing current without substantially increasing the quiescent current of the voltage regulator and without causing stability problems.

It is another object of the invention to provide a variable gain amplifier which provides low gain under normal, non-slewing operating conditions and provides high gain under slewing conditions.

It is another object of the invention to provide LDO voltage regulator circuitry including a variable gain error amplifier which provides low gain under normal, non-slewing operating conditions and provides high gain under slewing conditions and enables the LDO voltage regulator circuitry to provide a very fast, large-swing drive signal to the gate of an output transistor of the LDO voltage regulator circuitry in response to a step-current increase in the current demanded by a load to thereby provide a large slewing current without substantially increasing the quiescent current of the voltage regulator and without causing stability problems.

It is another object of the invention to provide an improved, more easily implementable operational amplifier having a high slew rate.

Briefly described, and in accordance with one embodiment, the present invention provides variable gain circuitry including a first input transistor having a source coupled to a first conductor, a gate coupled to a first input voltage, and a drain coupled to a second conductor. An input of a first current mirror is coupled to the second conductor to receive a current corresponding to the difference between the first input voltage and a second input voltage. An output of the first current mirror is coupled to a source of current. A first transistor has a gate coupled to a third conductor, a source coupled to a reference voltage, and a drain coupled to conduct output current. A second transistor and a resistive element are coupled in series between the third conductor and the first reference voltage, a gate of the second transistor being coupled to the third conductor to produce a nonlinear relationship between currents of the first transistor and the second transistor.

In one embodiment, the invention provides a variable gain circuitry including a first input transistor having a source coupled to receive a first current from a first conductor, a gate coupled to receive a first input voltage, and a drain coupled to a second conductor. A first current mirror has an input coupled to the second conductor to receive a second current having a value corresponding to a value of the first input voltage relative to a second voltage. The first current mirror also has an output coupled to a current source by means of a third conductor. A first amplifying transistor has a gate coupled to the third conductor, a source coupled to a first supply voltage, and a drain coupled to conduct at least a portion of a first output current. A first transistor and a resistive element are coupled in series between the third conductor and the first supply voltage, the first transistor having a gate coupled to the third conductor. In one embodiment, the resistive element is a resistor. In another embodiment, the resistive element is a second transistor.

In one embodiment, the first transistor has a source coupled to the first reference voltage and a drain coupled to a source of the second transistor, and the second transistor has a gate coupled to the second conductor and a drain coupled to the third conductor. In another embodiment, a third transistor has a source coupled to the first conductor, a gate coupled to the gate of the first input transistor, and a drain coupled to the drain of the first amplifying transistor. In another embodiment, a maximum-gain-limiting resistor is coupled between the drain of the first transistor and the third conductor.

In one embodiment, the variable gain circuitry is configured to provide slew boost in an operational amplifier which includes an input stage coupled to a folded cascode stage and a class AB output stage coupled to the folded cascode stage, wherein the first input transistor, the first current mirror, the first amplifying transistor, the first transistor and the resistive element cooperate to superimpose a slew boost signal on a gate of an output transistor of the class AB output stage. A second current mirror has an input coupled to the second conductor to receive a third current having the value corresponding to the value of the first input voltage relative to the second input voltage. The second current mirror also has an output coupled to a gate of a second amplifying transistor having a drain coupled by means of a third current mirror to provide a slew boost signal on a gate of a second output transistor of the class AB output stage.

In another embodiment, the variable gain circuitry is configured as a voltage regulator including a differential input stage including a first input coupled to receive a reference voltage, a second input coupled to a regulated output conductor of the voltage regulator, and an output. An output stage produces a regulated output voltage on the regulated output conductor and includes a first output transistor having a source coupled to a second supply voltage and a drain coupled to the regulated output conductor. A second output transistor has a source coupled to the first supply voltage and a drain coupled to the regulated output conductor. A cascode transistor has a source coupled to a gate of the second output transistor and a drain coupled to a gate of the first output transistor. The first input transistor, the first current mirror, the first amplifying transistor, the first transistor and the resistive element cooperate to function as an error amplifier. The gates of the first input transistor and the third transistor are coupled to the output of the differential input stage and the drains of the first amplifying transistor and the third transistor are coupled by a fourth conductor to the gate of the second output transistor.

In one embodiment, the current source includes a second input transistor having a source coupled by the first conductor to the source of the first input transistor, a gate coupled to a second input voltage, and a drain coupled to the third conductor.

In one embodiment, the first current mirror has an input coupled to the second conductor to receive a first current having a value corresponding to a value of the first input voltage relative to a second voltage. The first current mirror has an output coupled to a gate of a first amplifying transistor having a drain coupled to conduct at least a portion of a first output current. The variable gain circuitry also includes a second current mirror which has an input coupled to the second conductor to receive a second current having a value corresponding to a value of the first input voltage relative to a second voltage. The second current mirror has an output coupled to a gate of a second amplifying transistor having a drain coupled to conduct at least a portion of a second output current.

In one embodiment, the invention provides a method of operating an amplifier to provide variable amplifier gain, including providing a first input transistor having a source coupled to receive a first current from a first conductor, a gate coupled to receive a first input voltage, and a drain coupled to a second conductor, coupling an input of a first current mirror to the second conductor to receive a second current having a value corresponding to a value of the first input voltage relative to a second input voltage, coupling an output of the first current mirror to a current source by means of a third conductor, coupling a gate of an amplifying transistor to the third conductor, coupling a source of the amplifying transistor to a first reference voltage, and coupling a drain of the amplifying transistor to conduct at least a portion of an output current, and coupling a first transistor and a resistive element in series between the third conductor and the first reference voltage, the first transistor having a gate coupled to the third conductor to produce a nonlinear relationship between currents of the first transistor and the amplifying transistor.

In one embodiment, the method includes controlling the slewing of an operational amplifier including a differential input stage and a differential output stage receiving a differential input signal and an output stage including a first output transistor and a second output transistor each having a gate coupled to the input stage by superimposing an output signal produced in response to operation of the amplifying transistor onto a gate of one of the output transistors.

In one embodiment, the method includes controlling the accuracy of a regulated output voltage produced by a voltage regulator by applying the regulated output voltage to a feedback input of a differential input stage having a reference voltage applied to a reference input of the differential input stage and applying an output of the differential input stage to a control electrode of the third transistor having a first electrode coupled to an input of a class AB output stage which generates the regulated output voltage on an output conductor (6, producing a decrease in the value of the regulated output voltage in response to a step increase in load current demand by a load coupled to the output conductor, and supplying the load current demanded by the load by applying the decreased value of the regulated output voltage during the decrease in value to a first electrode of a second source follower transistor having a control electrode coupled to the output of the differential input stage to decrease current in a first current mirror having an output coupled to a current source and to a control electrode of an amplifying transistor, causing the current source to rapidly turn on the amplifying transistor to cause it to rapidly turn on a cascode transistor of the class AB output stage, and turning on a first output transistor of the class AB output stage in response to current produced by the cascode transistor.

In one embodiment, a the invention provides variable gain circuitry for producing a limited current in response to a value of an input signal having a magnitude significantly less than a predetermined value and a relatively unlimited current in response to a value of the input signal significantly greater than the predetermined value, the variable gain circuitry including a first input transistor having a source coupled to receive a first current from a first conductor, a gate coupled to receive a first input voltage, and a drain coupled to a second conductor, means for coupling an input of a first current mirror to the second conductor to receive a second current having a value corresponding to a value of the first input voltage relative to a second input voltage, means for coupling an output of the first current mirror to a current source, means for coupling a gate of an amplifying transistor to a third conductor, coupling a source of the amplifying transistor to a first reference voltage, and coupling a drain of the amplifying transistor to conduct at least a portion of an output current, and means for coupling a first transistor and a resistive element in series between the third conductor and the first reference voltage, the first transistor having a gate coupled to the third conductor to produce a nonlinear relationship between currents of the first transistor and the amplifying transistor.

DETAILED DESCRIPTION OF THE PREFERRED EMBODIMENTS

A solution to the above described problems of avoiding use of external load bypass capacitors and avoiding the associated voltage drops across parasitic wire bond inductances is the development of "embedded" on-chip LDO voltage regulators capable of responses to large, instantaneous large step changes in demanded load current which are much faster (e.g., 1-5 nanoseconds) than has previously been achievable.

To this end, and also to the end of providing improved slew boost in operational amplifiers, the present invention provides a new variable gain amplifier. Use of the variable gain amplifier in accordance with the present invention provides an operational amplifier having very fast, symmetrical slewing and settling, and also provides very fast response to large step changes in demanded load current and also provides very stable circuit operation. The invention also provides a low-dropout voltage regulator which includes the variable gain amplifier in the error amplifier thereof.

Figure 1:
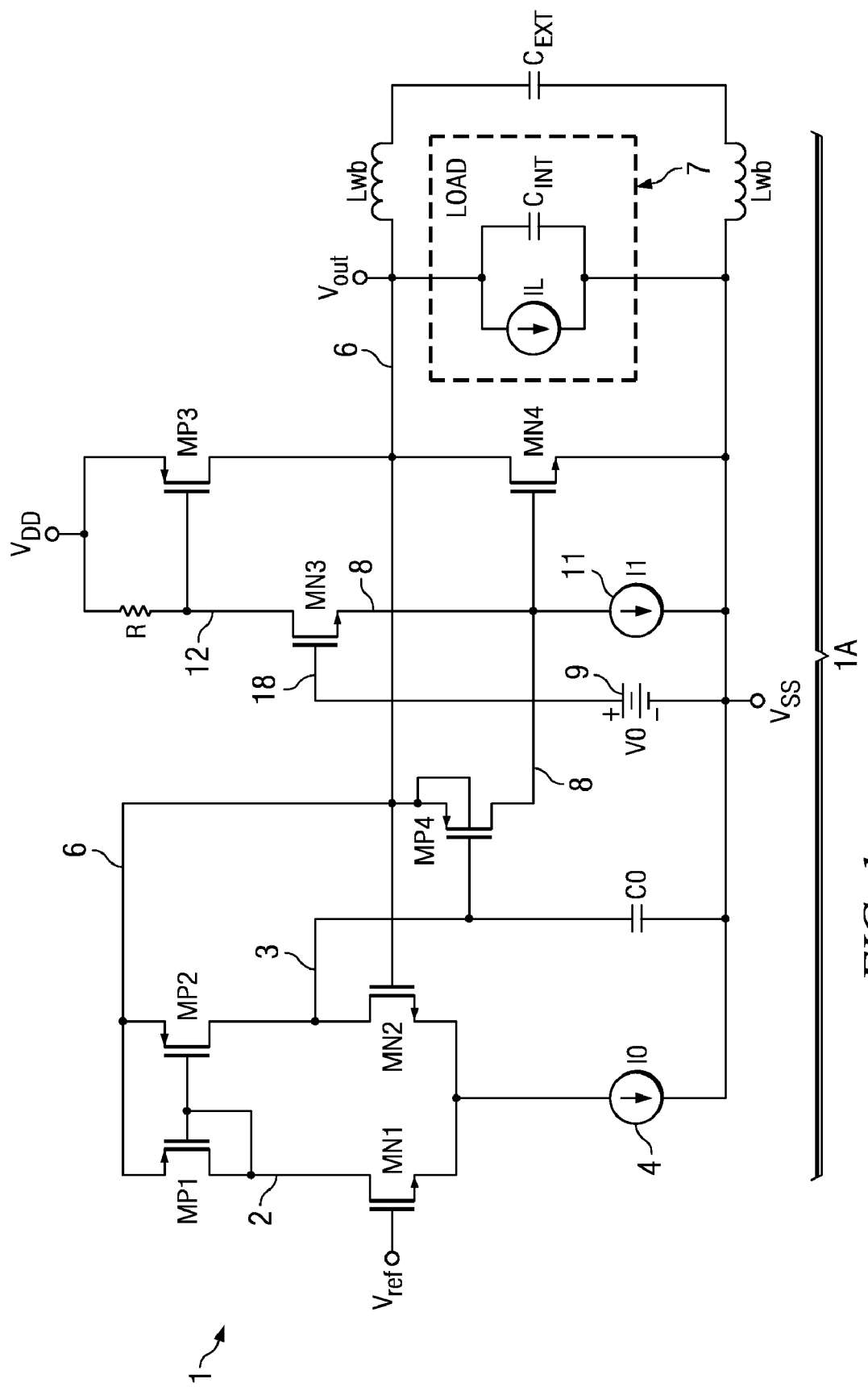
FIG. 1 is a schematic diagram of a prior art low-drop voltage regulator circuit.
Figure 2:
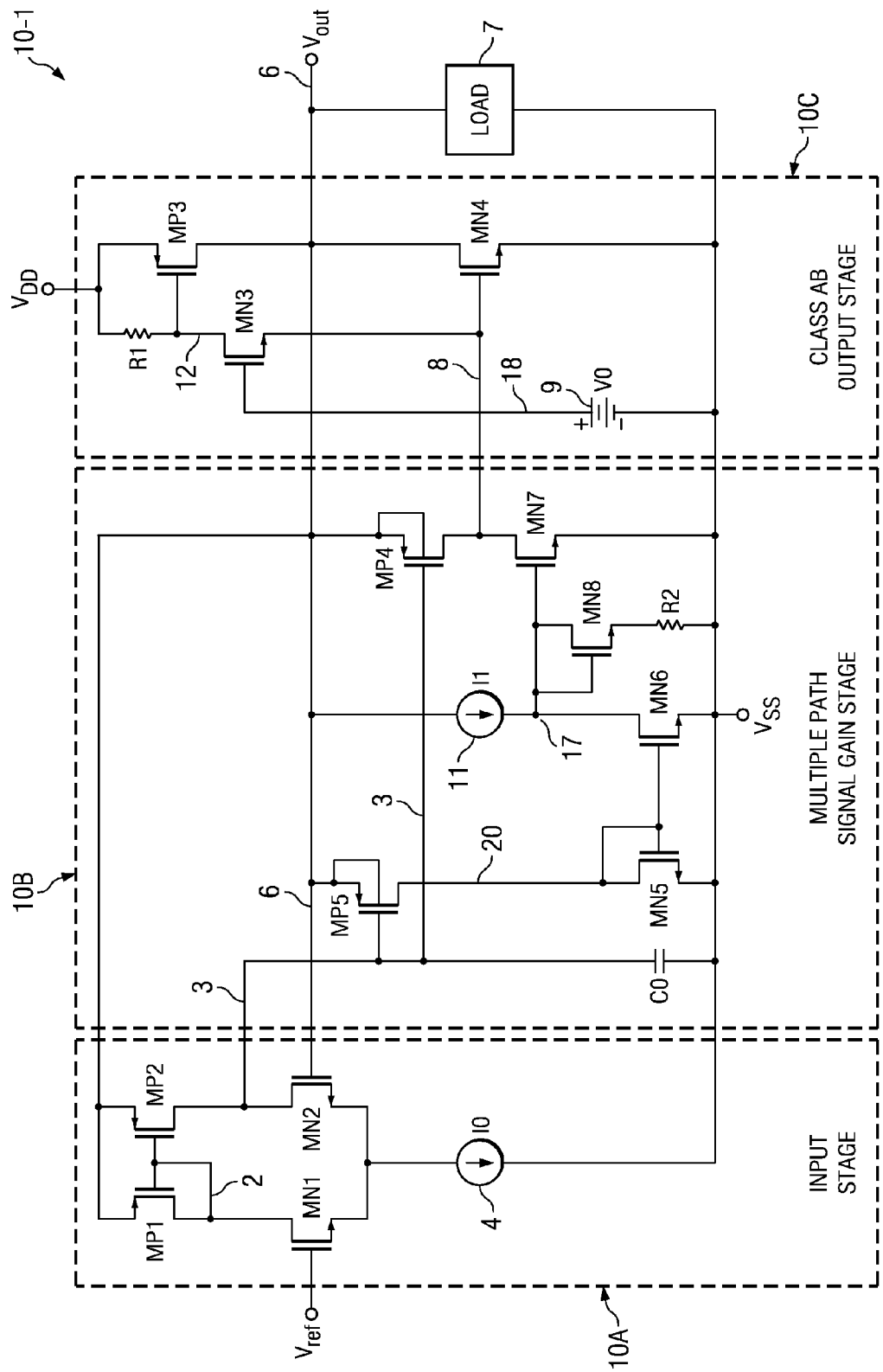
FIG. 2 is a schematic diagram of an internal low-drop voltage regulator, problems of which are solved in accordance with the present invention.

FIG. 2 (which is the same as FIG. 3 of the assignee's above mentioned pending patent application) shows an LDO voltage regulator 10-1 which has been developed to solve the above mentioned problems of the LDO voltage regulator in Prior Art FIG. 1. LDO voltage regulator 10-1 can be embedded in an integrated circuit chip to provide very fast-responding load voltage regulation, with reaction times of roughly 1-5 nanoseconds (at the present state-of-the-art), in response to step changes in the amount of current demanded by a load (such as state-of-the-art integrated digital logic circuitry) without substantially increasing the power consumption of the LDO voltage regulator and without the need to use a large external load bypass capacitor as required by the prior art voltage regulators. Voltage regulator 10-1 uses a single gain stage including multiple current gain boost paths, including an additional gain loop to in effect amplify the current I1 of Prior Art FIG. 1 during a step in the demanded load current.

LDO voltage regulator 10-1 includes an input stage 10A including differentially coupled N-channel input transistors MN1 and MN2, P-channel active load transistors MP1 and MP2, and tail current source 4. LDO voltage regulator 10-1 also includes a class AB output stage 10C including P-channel pass transistor MP3, N-channel pull-down transistor MN4, N-channel cascode transistor MN3, and voltage source 9 which produces a constant bias voltage V0. Gain stage 10B is coupled between differential input stage 10A and class AB output stage 10C, and includes P-channel source follower transistors MP4 and MP5, N-channel current mirror transistors MN5 and MN6, N-channel transistor MN7, and constant current source 11 which produces a current I1. Input stage 10A and a gain stage 10B form the error amplifier of voltage regulator 10-1.

The sources of input transistors MN1 and MN2 are connected to tail current source 4. The gate of input transistor MN1 is connected to reference voltage Vref, and the gate of input transistor MN2 is connected to regulated output voltage conductor 6 on which the regulated output voltage Vout is produced. The drains of input transistors MN1 and MN2 are connected by conductors 2 and 3 to the drains of active load transistors MP1 and MP2, respectively. The gates of load transistors MP1 and MP2 are connected to conductor 2 and their sources are connected to output conductor 6. (Note that the sources of load transistors MP1 and MP2 could be connected to $V_{DD}$ instead of output conductor 6, and there are numerous other implementations of input stage 10A which could provide satisfactory performance.)

Output conductor 6 also is connected to the drain of pass transistor MP3, the source of which is connected to $V_{DD}$, and to the drain of pull-down transistor MN4, the source of which is connected to $V_{SS}$. As in Prior Art FIG. 1, output conductor 6 also is connected to a load circuit 7 which "demands" a load current that may undergo very fast, large-magnitude transitions. The gate of pass transistor MP3 is connected by conductor 12 to the drain of cascode transistor MN3 and to one terminal of a pull-up resistor R1, the other terminal of which is connected to $V_{DD}$. The source of cascode transistor MN3 is connected by conductor 8 to the gate of pull-down transistor MN4. The gate of cascode transistor MN3 is connected by conductor 18 to receive the bias voltage V0 on the (+) terminal of voltage source 9, the (−) terminal of which is connected to $V_{SS}$.

The source and bulk electrodes of source follower transistors MP4 and MP5 are connected to Vout by means of regulated output conductor 6. Their gates are connected by conductor 3 to the drains of input transistor MN2 and load transistor MP2. The drain of source follower transistor MP5 is connected by conductor 20 to the gate and drain of a current source input transistor MN5, the source of which is connected to $V_{SS}$. The gate of current mirror output transistor MN6 is also connected to conductor 20 and its source is connected to $V_{SS}$. The drain of current mirror output transistor MN6 is connected by conductor 17 to the gate of an amplifying transistor MN7 and to one terminal of current source 11. The other terminal of current source 11 is connected to regulated output voltage conductor 6. The source of amplifying transistor MN7 is connected to $V_{SS}$, and its drain is connected by conductor 8 to the gate of pull-down transistor MN4, the source of cascode transistor MN3, and the drain of source follower transistor MP4. An internal capacitor C0 is connected between conductor 3 and $V_{SS}$.

LDO voltage regulator 10-1 of FIG. 2 includes three feedback loops. A first "accuracy" feedback loop of voltage regular 10-1 includes input transistors MN1 and MN2 and source follower transistor MP4. A second feedback loop includes common-gate source follower transistor MP4, pull-down transistor MN4, cascode transistor MN3, and pass transistor MP3. A third feedback loop includes common-gate transistor MP5, current mirror transistors MN5 and MN6, transistor MN7, cascode transistor MN3, and pass transistor MP3. Internal capacitor C0 provides compensation for the first feedback loop. Capacitor C0 also decreases the bandwidth of the "accuracy" feedback loop including transistors MN1 and MN2 and source follower transistor MP4, thereby decreasing the overall peak-to-peak noise at the output of voltage regulator 10.

In class AB output stage 10C, pull-down transistor MN4 turns off when its gate voltage is sufficiently decreased. The constant bias voltage V0 on conductor 18 causes the current in cascode transistor MN3 to be increased when the voltage on conductor 8 is decreased enough to turn pull-down transistor MN4 off, so as to maintain a minimum current in pull-down transistor MN4. The value of bias voltage V0 and the sizing of cascode transistor MN3 and pull-down transistor MN4 determines the minimum current in pull-down transistor MN4. If source follower transistors MP4 and MP5 are matched to each other and also to current mirror transistors MN5 and MN6, then the currents through source follower transistors MP5 and MP4 are equal to I1 during constant load conditions. Current through amplifying transistor MN7 is equal to sum of the currents through source follower transistor MP4 and cascode transistor MN3.

If the load current demanded by load 7 undergoes a large step decrease from, for example, 50 milliamperes to zero, then Vout rapidly increases because load 7 suddenly is not sinking the large current being supplied by pass transistor MP3. That increases the source voltage of source follower transistor MP4, causing it to turn on harder. That causes the gate voltage of pull-down transistor MN4 to rapidly increase. Pull-down transistor MN4 immediately sinks the available charge from capacitance associated with output conductor 6, allowing sufficient time for pass transistor MP3 to decrease its drain current. The rate at which the amplified drain current produced by pass transistor MP3 decreases is determined by its gate capacitance and the resistance of pull-up resistor R1. Thus, voltage regulator 10-1 of FIG. 2 responds very rapidly to a step decrease in the demanded load current from a large value to a small value.

During a step increase of the current demanded by load 7 from zero to a very high value, a large amount of current must be supplied by pass transistor MP3. That requires the gate voltage of the pass transistor MP3 to rapidly decrease by, for example, a few hundred millivolts. But pass transistor MP3 is a very large device having a very large gate capacitance which may be in the range from roughly 0.5 to 10 picofarads, depending on the application for which LDO voltage regulator 10-1 is being designed. Thus, a large amount of current must be drawn out of the large gate capacitance of pass transistor MP3. In contrast, in Prior Art FIG. 1 the only current available to be drawn through cascode transistor MN3 from the gate capacitance of pass transistor MP3 is the relatively small current I1, which determines the power consumption of prior art voltage regulator 1 and preferably should not be increased. The foregoing large step increase in demanded load current causes the regulated output voltage Vout to rapidly decrease. That decreases the currents through source follower transistors MP5 and MP4. The instant that source follower transistor MP5 is turned off, there is No more current flows into current mirror input transistor MN5 after the instant at which source follower transistor MP5 is turned off. This allows the constant current I1 to turn transistor MN7 on harder. The increased current through transistor MN7 causes cascode transistor MN3 to turn on harder and increases its drain current to thereby rapidly discharge the large gate capacitance of pass transistor MP3 so as to rapidly turn it on to supply the step increase in the demanded load current.

If transistor MP5 in FIG. 2 is matched to transistors MP4, MN5, and MN6, then the currents in transistors MP5 and MP4 are equal to I1 during constant load conditions. The current through transistor MN7 is equal to sum of the currents in transistors MP4 and MN3. During a step increase in the amount of load current, Vout decreases, and this decreases the currents in transistors, MP5 and MP4, and the current I1 causes transistor MN7 to turn on this causes the current in transistor MN3, to increase as needed to charge the large gate capacitance of the large pass transistor MP3 in order to turn it on in response to the step increase in the load current.

This additional "link" or gain loop including transistors MP5, MN5, MN6 and MN7 has a large gain equal to gmn6*Rg7, where gmn6 is the transconductance of transistor MN6 and Rg7 is equivalent resistance at the gate of transistor MN7. Unfortunately, this large amount of gain causes instability and oscillations in the feedback loop including transistors MP5, MN6, MN7, and MN4.

The present invention addresses the problems of LDO voltage regulator 10-1 by providing the error amplifier with a variable gain stage having a current input (i.e., low impedance input) and non-linear gain that has a low value for low input signal magnitude and a high value for high input signal magnitude. Two modifications have been made to the current-input error amplifier 10B of FIG. 2 so as to provide variable-gain amplifiers that have low gain for small magnitude values of the input signal Vin and high gain for large magnitude values of Vin. Specifically, in order to achieve stability in this feedback loop, the present invention provides a variable gain amplifier to be used in place of error amplifier 10B FIG. 2. A diode-connected transistor MN8 is provided with its gate and drain connected to conductor 17 and its source connected to one terminal of a resistor R2 having its other terminal connected to $V_{SS}$, as shown in subsequently described FIG. 3. This decreases gain in the foregoing feedback loop, thereby achieving improved system stability.

Figure 3:
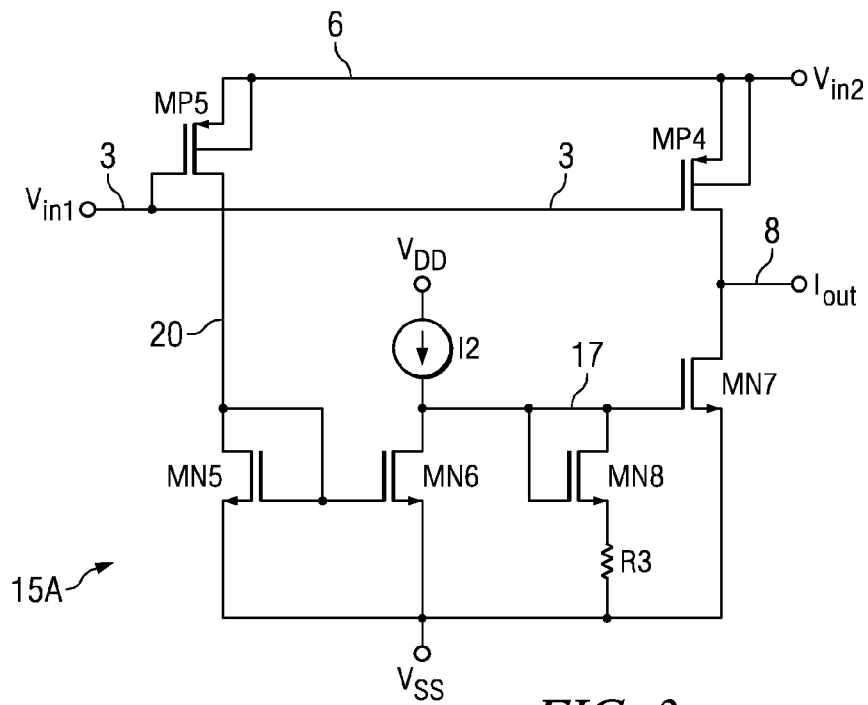
FIG. 3 is a schematic diagram of a variable gain amplifier according to the present invention.

FIG. 3 shows a variable gain amplifier 15A which includes P-channel source follower transistors MP4 and MP5 each having a source electrode and bulk electrode coupled to conductor 6. Conductor 6 conducts an input voltage Vin2. The gate of each of source follower transistors MP4 and MP5 is connected to conductor 3, to which an input voltage Vin1 is applied. The drain of source follower transistor MP5 is connected by conductor 20 to the gate and drain of N-channel current mirror input transistor MN5 and to the gate of N-channel current mirror output transistor MN6. The sources of transistors MN5 and MN6 are connected to $V_{SS}$. The drain of current mirror output transistor MN6 is connected by conductor 17 to a current source I2, to the gate and drain of a N-channel transistor MN8, and to the gate of a N-channel transistor MN7, the source of which is connected to $V_{SS}$. The source of transistor MN8 is connected to one terminal of a resistor R3, the other terminal of which is connected to $V_{SS}$. The drain of transistor MN7 is connected by conductor 8 to the drain of source follower transistor MP4. An output current Iout is conducted by conductor 8.

In variable gain amplifier 15A, the sources of source follower transistors MP4 and MP5 are connected together, to Vin2 on conductor 6, and their gates are connected to Vin1 on conductor 3. The input signal of variable gain amplifier 15A is the voltage difference Vin2−Vin1 between sources and gates of transistors MP5 and MP4. The input impedance at the Vin2 input is low, equal to 1/(gmp4∥gmp5), i.e., equal to 1 divided by the combined parallel transconductances of transistors MP5 and MP4. Consequently, approximately equal currents flow through source follower transistors MP4 and MP5 (although load currents in transistors MP5 and MP4 could be geometrically scaled instead). When the current in transistor MP5 decreases, the current in transistor MN5 also decreases. Consequently, the fraction of current I2 flowing through transistor MN6 decreases and therefore more of the current I2 flows through transistor MN8 and resistor R3 and creates a larger voltage drop across resistor R3. That turns transistor MN7 on harder, thereby increasing its current, for example to a value substantially greater than the current I2. This circuit configuration and circuit operation cause the current in transistor MN7 to have a nonlinear dependence on the current in transistor MP5.

During normal (i.e., non-slewing) operation, the current in transistor MP5 is relatively large, and the currents in transistors MN5 and MN6 therefore also are relatively large. Consequently, a much lower fraction of I2 flows through transistor MN8 and resistor R3, causing the current in transistor MN7 to become much smaller. Thus, the dependence between the currents in transistors MN8 and MN7 is very nonlinear because of the presence of resistor R3. However, a problem of variable gain amplifier 15A of FIG. 3 is that its gain is very sensitive to the absolute values of current I2 and resistor R3. Consequently, variable gain amplifier 15A of FIG. 3 can become unstable if the integrated circuit manufacturing process parameters are not tightly controlled.

When the differential input voltage Vin2−Vin1 is substantially greater than the threshold Vthp4 of transistor MP4, i.e., during slewing operation, the gain of variable gain amplifier 15A is approximately equal to the transconductance gmp4 of transistor MP4, which increases with Vin2. The current through current mirror input transistor MP5 is equal to the current through transistor MP4, and is mirrored by the current mirror MN5, MN6, and thereby turns off amplifying transistor MN7. When the differential input voltage Vin2−Vin1 is substantially smaller than the threshold Vthp4 of transistor MP4, the currents through source follower transistors MP4 and MP5 decrease, the current through current mirror MN5, MN6 decreases accordingly, and current from current source I2 turns on amplifying transistor MN7 harder.

The current connected I2 is split between transistors MN6 and MN8, which determines the current through transistor MN7 and source follower transistors MP4 and MP5. The ratio of the current split is determined by the absolute values of R3 and I2 and the channel-width-to-channel-length ratios of transistors MN7 and MN8. Variable gain amplifier 15A has lower gain under normal, non-slewing operating conditions wherein the differential input voltage Vin2−Vin1 is approximately equal to Vthp4. However, the currents in all of transistors MP5, MP4, and MN5, and also the amplifier gain, are sensitive to the absolute values of resistor R3 and the constant current I2. This makes it impractical to use variable gain amplifier 15A in integrated circuits are located using manufacturing processes having a wide spread of component parameters. The variable gain amplifier 15B of FIG. 4 solves the above mentioned problems of variable gain amplifier 15A of FIG. 3.

Figure 4:
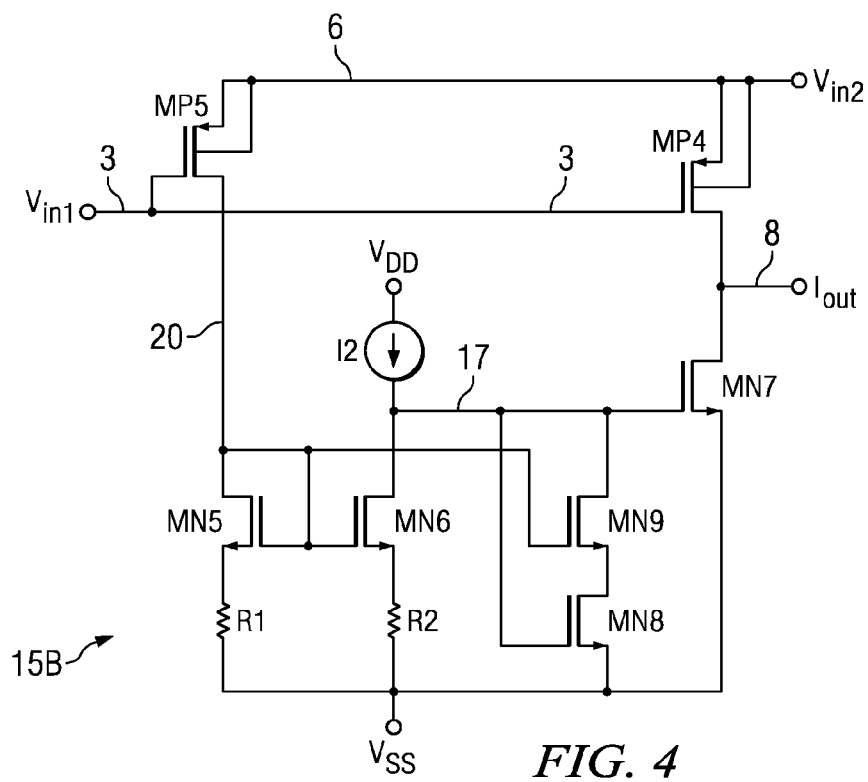
FIG. 4 is a schematic diagram of another variable gain amplifier according to the present invention.

Referring to FIG. 4, variable gain amplifier 15B is the same as variable gain amplifier 15A of FIG. 3 except that N-channel transistors MN8 and MN9, instead of transistor MN8 and resistor R3, are coupled in series between conductor 17 and $V_{SS}$. The gate of transistor MN8 is connected to conductor 17, and the gate of transistor MN9 is connected to conductor 20.

The values of resistors R1 and R2 in variable gain amplifier 15B are selected such that in normal (non-slewing) operation, i.e., when the current of MP5 is relatively large, the voltage drop across each of resistors R1 and R2 is 150 to 300 millivolts. The voltage of the source of transistor MN9 also is 150 to 300 millivolts because its gate is connected to the gates of transistors MN5 and MN6, and 150 millivolts on the source of transistor MN9 is sufficiently large value to keep transistor MN8 out of its triode operating region. Thus, transistor MN9 functions as a cascode device for transistor MN8 during normal operation when the current of MP5 is relatively large. Consequently, the currents of transistors MN8 and MN7 are precisely equal. Also, the currents in transistors MN7 and MN8 are equal to the currents in transistors MN5 and MN6, and the current in transistor MP5 is equal to the current in MP4.

If transistor MP5 turns off during slewing operation there is no more current in resistors R1 and R2. Therefore the gate voltage of transistor MN5 decreases, causing the source voltage of MN9 to also decrease. That causes transistor MN8 to begin operating in its triode region. Consequently, current source I2 causes the voltage of conductor 17 to increase. This causes the current through MN7 to become relatively unlimited, because transistor MN8 no longer functions as a current input transistor.

Thus, the gain of variable gain amplifier 15A is very nonlinear. When it is in normal (non-slewing) operation the current of transistor MP5 is large, and the gain of the circuit is approximately equal to 1 because all of the above-mentioned the currents are equal. However, when the current of transistor MP5 decreases, the gain of variable gain amplifier 15B becomes relatively unlimited, typically in the range of 40-60 dB.

To summarize, in normal (non-slewing) operation the circuit operation is linear and the amplifier gain is small. When the gain is small, it is easy to capacitively compensate variable gain amplifier 15B. When circuit operation becomes nonlinear as a result of transistor MN8 going into its triode mode due to the beginning of slewing operation, then the gain of variable gain amplifier 15B increases. Then a very large current during slewing may be needed from transistor MN7.

In slewing operation, compensation is not needed. Therefore, variable gain amplifier 15B provides the needed very fast transient response during slewing in combination with good stability during normal low signal input signal magnitude operation.

Resistors R1 and R2 can be chosen to have a 100-200 millivolt voltage drop with each having half of the current I2 flowing through them. When the differential input voltage Vin2−Vin1 is approximately equal to the threshold voltage Vthp4, transistor MN9 functions as a cascode device for transistor MN8, the currents of transistors MN7 and MN8 are closely matched, and the currents through transistors MP4, MP5, MN6, and MN8 all are approximately equal to one half of I2. As in variable gain amplifier 15A of FIG. 3, when the differential input voltage Vin2−Vin1 of variable gain amplifier 15B of FIG. 4 is substantially greater than the threshold voltage Vthp4, the gain of variable gain amplifier 15B is approximately equal to the transconductance gmp4 of transistor MP4, which increases with Vin2.

When the differential input voltage Vin2−Vin1 is approximately equal to the threshold voltage Vthp4, i.e., during normal non-slewing operation, the gain of variable gain amplifier 15B is approximately equal to the transconductances gmn8=gmn7=gmp4 if MN7 is precisely matched to transistor MN8. This configuration ensures stable and "robust" amplifier gain during normal non-slewing operation. However, when the magnitude of the differential input voltage Vin2−Vin1 is sufficiently less than the threshold voltage Vthp4 to cause slewing operation, the current in transistor MP5 decreases, the voltage on the gate of transistor MN6 decreases, and transistor MN9 operates to substantially decrease the current through transistor MN8. Since the impedance of transistor MN8 does not affect the gain of variable gain amplifier 15B during the slewing operation, the amount of current through transistor MN7 becomes relatively unlimited.

Figure 5:
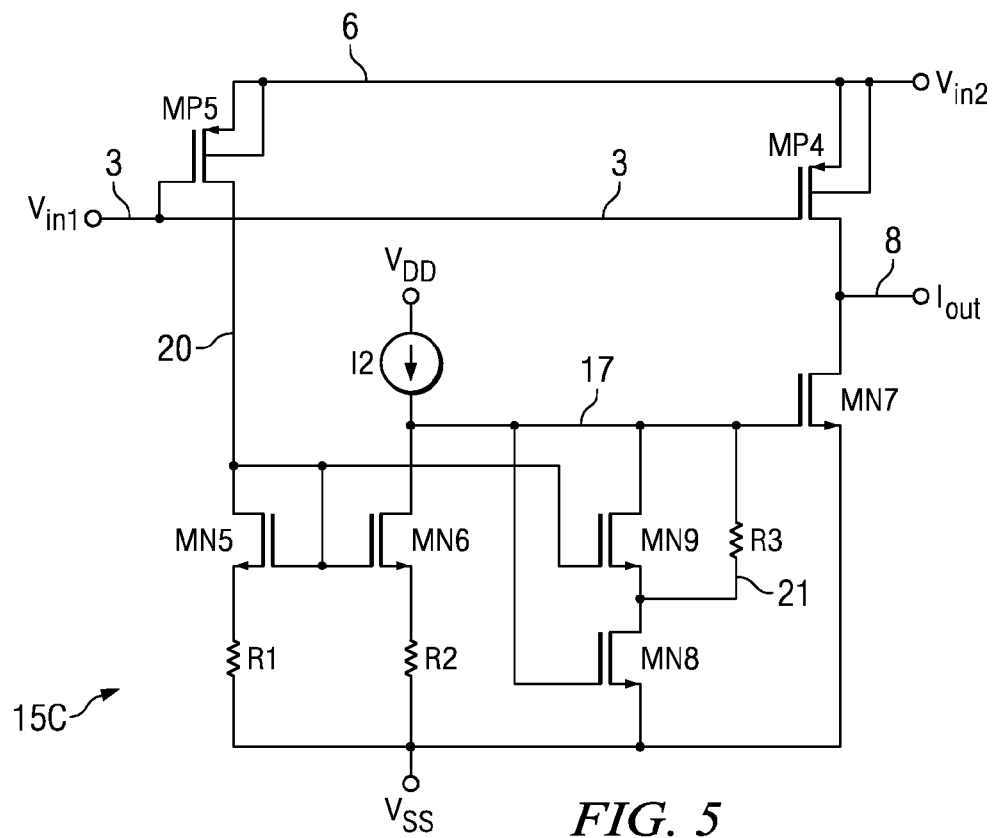
FIG. 5 is a schematic diagram of a variation of the variable gain amplifier of FIG. 4.

The variable gain amplifiers of FIGS. 4 and 5 ensure stability during normal, i.e., non-slewing, operation by keeping the gain of these variable gain amplifiers low, and at the same time are able to provide virtually unlimited output current during slewing operation, thereby ensuring low transient error during switching of the voltage regulator load.

In variable gain amplifier 15C of FIG. 5, resistor R3 is connected between conductor 17 and the junction 21 between the source of transistor MN9 and the drain of transistor MN8 to limit the voltage on the gate of transistor MN7 if desired, for example, to protect the gate of transistor MN7 from rising to a voltage that is high enough to damage transistor MN7.

Figure 6:
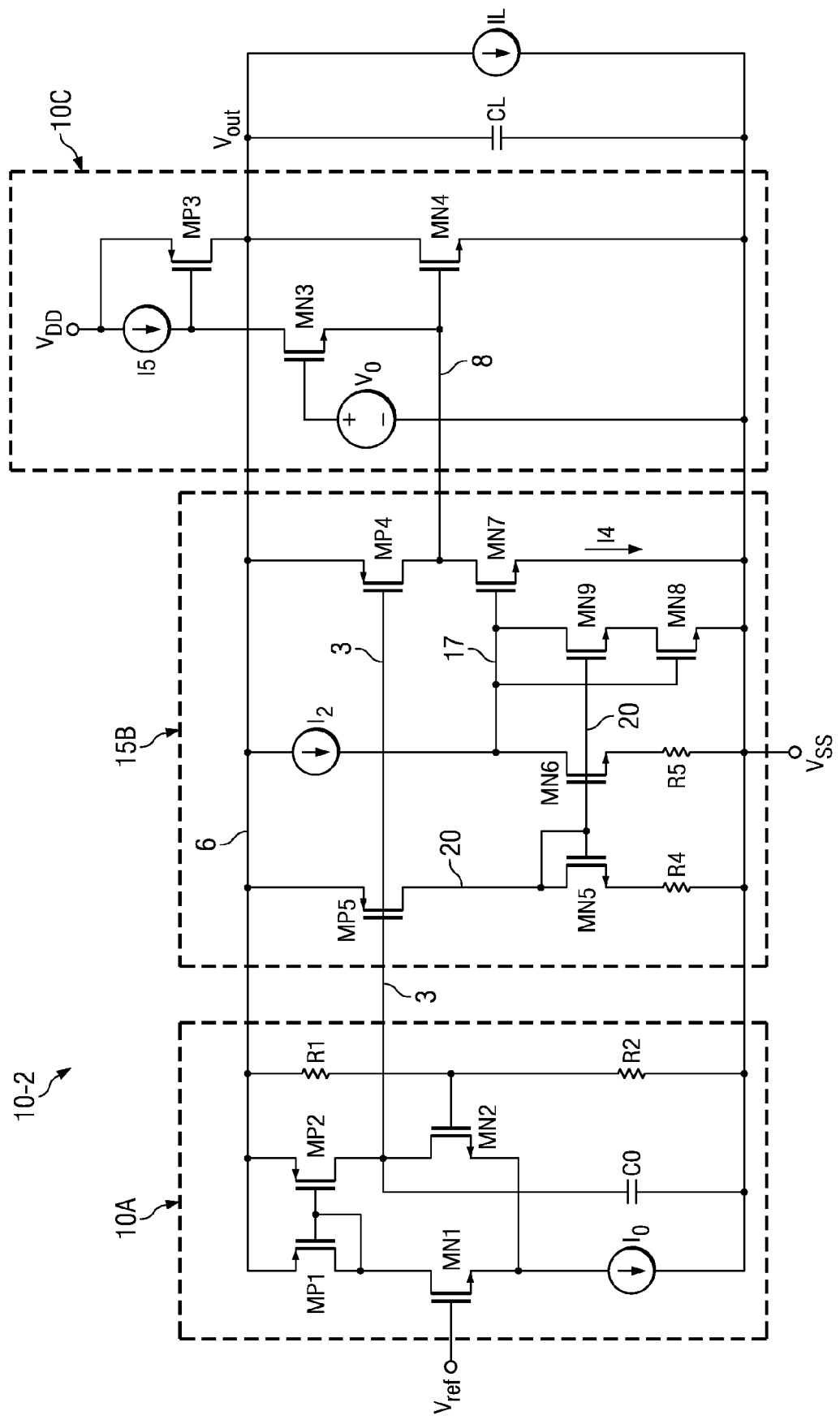
FIG. 6 is a schematic diagram of a low-dropout voltage regulator which includes the variable gain amplifier of FIG. 5.

Referring to FIG. 6, low-dropout voltage regulator 10-2 is the same as low-dropout voltage regulator 10-1 shown in FIG. 2 except the multi-path signal gain stage 10B in FIG. 2 has been replaced by variable gain amplifier 15B of FIG. 4.

It should be appreciated that the basic variable gain amplifier cells shown in FIGS. 3, 4 and 5 and/or variations thereof can be used in various circuits, including but not limited to low-dropout voltage regulators.

Figure 7:
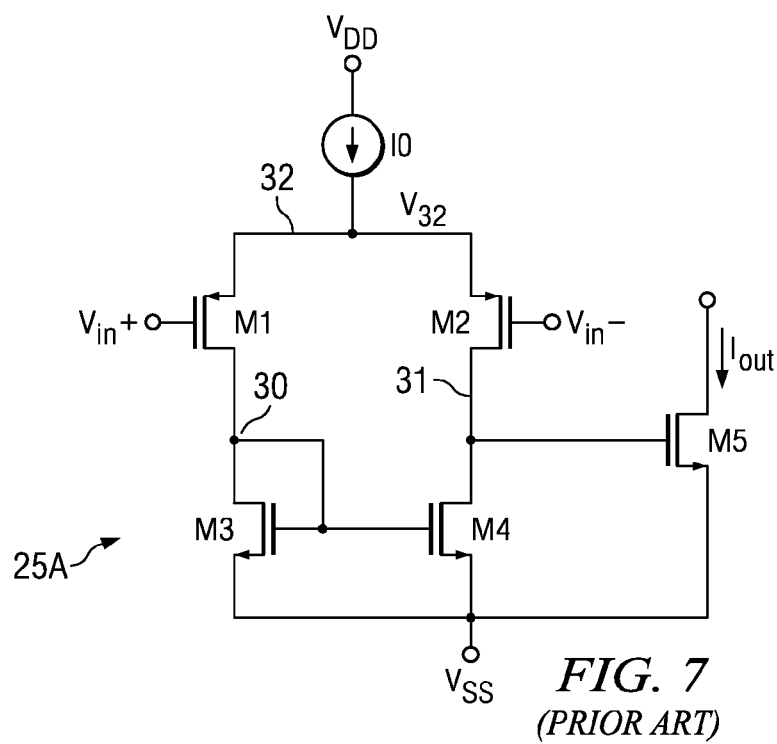
FIG. 7 is a schematic diagram of prior art variable gain amplifier.
Figure 8:
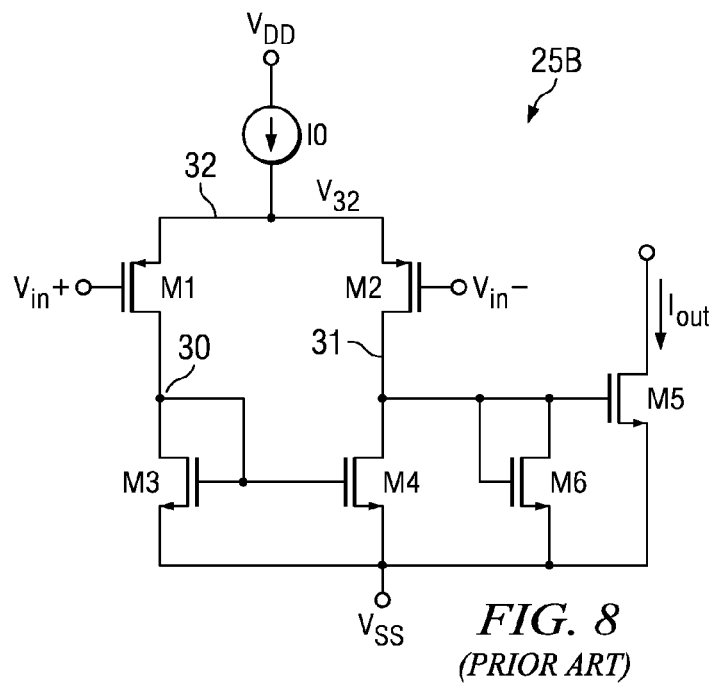
FIG. 8 is a schematic diagram of a variation on the variable gain amplifier of FIG. 7.

Prior Art FIGS. 7 and 8 show two conventional simple operational amplifier stages 25A and 25B, respectively, which are not variable gain amplifiers. The variable gain amplifier 15A of FIG. 4 is the same as differential input stage amplifier 25A of Prior Art FIG. 8 except that transistor M2 is replaced by a constant current source I2. The gain (dIout/dVin) of high gain amplifier 25A of Prior Art FIG. 7 is equal to $gm0*Z_{31}*gm5$, where gm0 is the combined transconductance of the stage including input transistors M and/M2 stage, $Z_{31}$ is the impedance at node 31, and gm5 is tranconductance of transistor M5. It is large and has a low-frequency pole due to the parasitic capacitance at node 31. The high gain of prior art differential amplifier 25A of FIG. 7 can be decreased by adding diode-connected transistor M6, as shown in FIG. 8. This results in a low amplifier gain equal to gm0 and a maximum output current equal to I0.

Figure 9A:
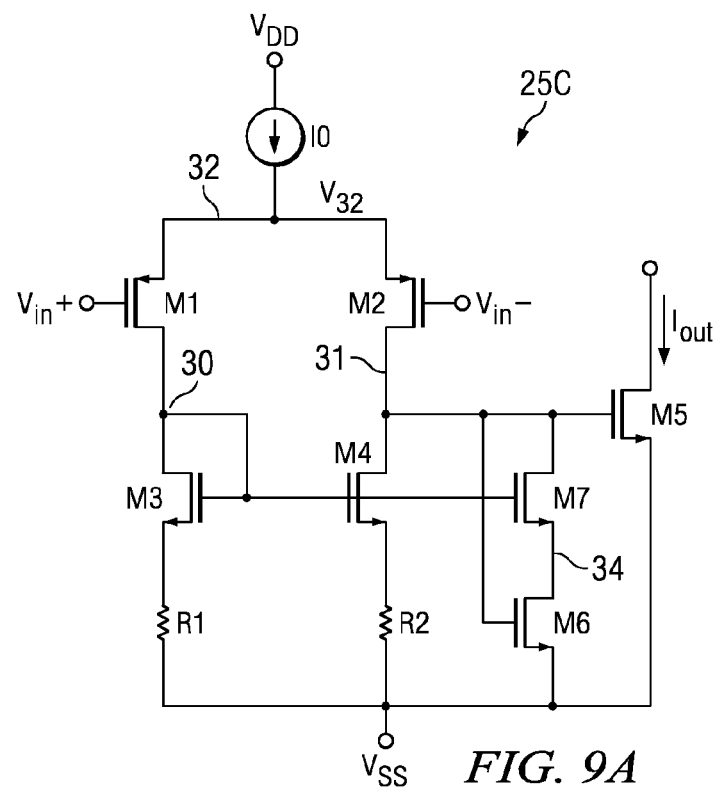
FIGS. 9A and 9B are schematic diagrams of further variations on the variable gain amplifier of FIG. 8.

FIG. 9A shows a variable gain amplifier 25C which is the same as the variable gain amplifier of FIG. 4 except that the current source I2 in FIG. 4 has been replaced by P-channel transistor M2 in the variable gain amplifier 25C in FIG. 9A, so that a differential input signal $Vin^+-Vin^-$, rather than only a single-ended input Vin1 is applied to variable gain amplifier 25C. A single-ended output current Iout is produced in response to the differential input signal. This variable gain amplifier provides low gain (gm0) in response to a small amplitude differential input signal and large gain in response to a large amplitude differential input signal. If Vin+ increases relative to Vin−, the amount of current in input transistor M1 decreases, the current through current mirror output transistor M4 decreases, and the current through input transistor M2 increases. The decreasing current through current mirror input transistor M4 combined with the increasing current through input transistor M2 results in a much more rapidly rising voltage on conductor 31 than would be the case if input transistor M2 is replaced by a constant current source I2 as shown in FIG. 4. The rapidly rising voltage on conductor 31 therefore very rapidly turns amplifying transistor M5 on, causing it to produce a relatively unlimited output current Iout. Note, however, that the operation of variable gain amplifier 25C of FIG. 9A is not symmetric because part of the current flows through diode-connected transistor M6.

Figure 9B:
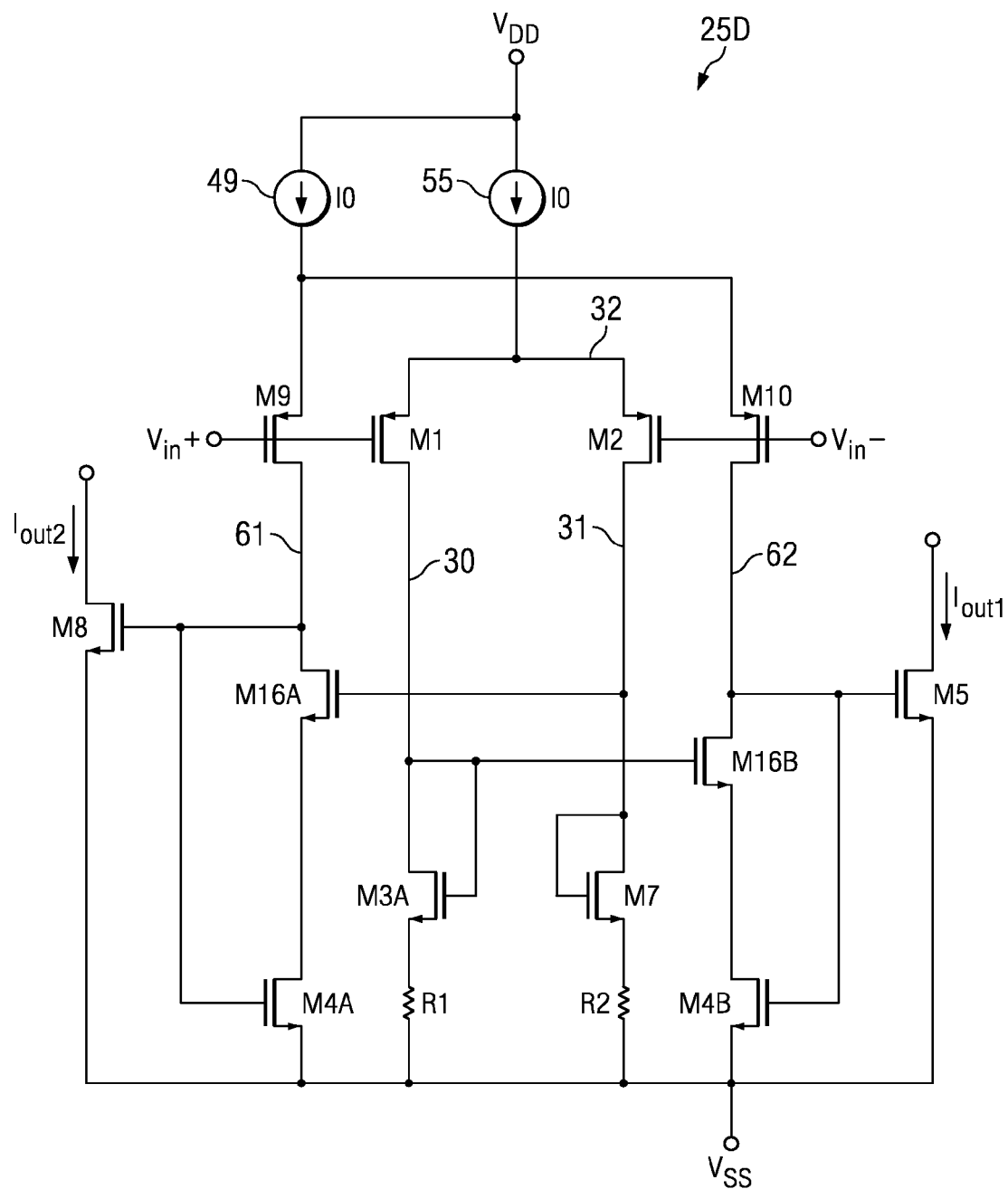

FIG. 9B shows a fully differential variant 25D of FIG. 9A in which a differential output current Iout2−Iout1 is produced in response to the differential input voltage $Vin^+-Vin^-$. In FIG. 9B, variable gain amplifier 25D includes a pair of P-channel source-coupled input transistors M1 and M2 having their gates coupled to Vin+ and Vin−, respectively, and also includes another pair of P-channel source-coupled input transistors M9 and M10 also having their gates coupled to Vin+ and Vin−, respectively. The common sources of input transistors M1 and M2 are coupled to a current source 55 which produces a constant current I0, and the common sources of input transistors M9 and M10 are coupled to a current source 49 which produces a constant current I0. The drain of input transistor M1 is connected by conductor 30 to the gate and drain of a diode-connected N-channel transistor M3A and to the gate of a N-channel transistor M16B. A resistor R1 is coupled between the source of diode-connected transistor M3A and $V_{SS}$. The drain of transistor M16B is connected by conductor 62 to the drain of input transistor M10, the gate of a N-channel amplifying transistor M5, and the gate of a N-channel current mirror output transistor M4B having its source connected to $V_{SS}$. The source of amplifying transistor M5 is connected to $V_{SS}$ and its drain is connected to the gate of output transistor MN4 by means of conductor 51.

Similarly, the drain of input transistor M2 is connected by conductor 31 to the gate and drain of a diode-connected N-channel transistor M7 and to the gate of a N-channel transistor M16A. A resistor R2 is coupled between the source of diode-connected transistor M7 and $V_{SS}$. The drain of transistor M16A is connected by conductor 61 to the drain of input transistor M9, the gate of a N-channel amplifying transistor M8, and the gate of a N-channel current mirror output transistor M4A having its source connected to $V_{SS}$. The source of amplifying transistor M8 is connected to $V_{SS}$.

In normal operation, the circuitry has very low gain because of the current mirror formed by transistor M3A, resistor R1, and transistors M16B and M4B and also because of the other current mirror formed by transistor M7, resistor R2, and transistors M16A and M4B. During slewing operation caused by a large magnitude differential input signal, the voltage drop across resistor R1 or R2 decreases and accordingly the voltage of the gate of transistor M16A or transistor M16B decreases. That in effect disconnects diode-connected transistor M4A or M4B, and that causes the current Iout1 or Iout2 in amplifying transistor M5 or M8 to be relatively unlimited.

It would be desirable to have operational amplifiers having faster slew rates which can be implemented more easily than prior operational amplifiers including slew boost circuits/amplifiers. In accordance with the present invention, it was recognized that an easily implementable operational amplifier having a fast slew rate could be accomplished by means of a variable gain amplifier characterized by low gain for a small magnitude of the input signal Vin and high gain when the magnitude of input signal Vin exceeds a threshold level.

Figure 10:
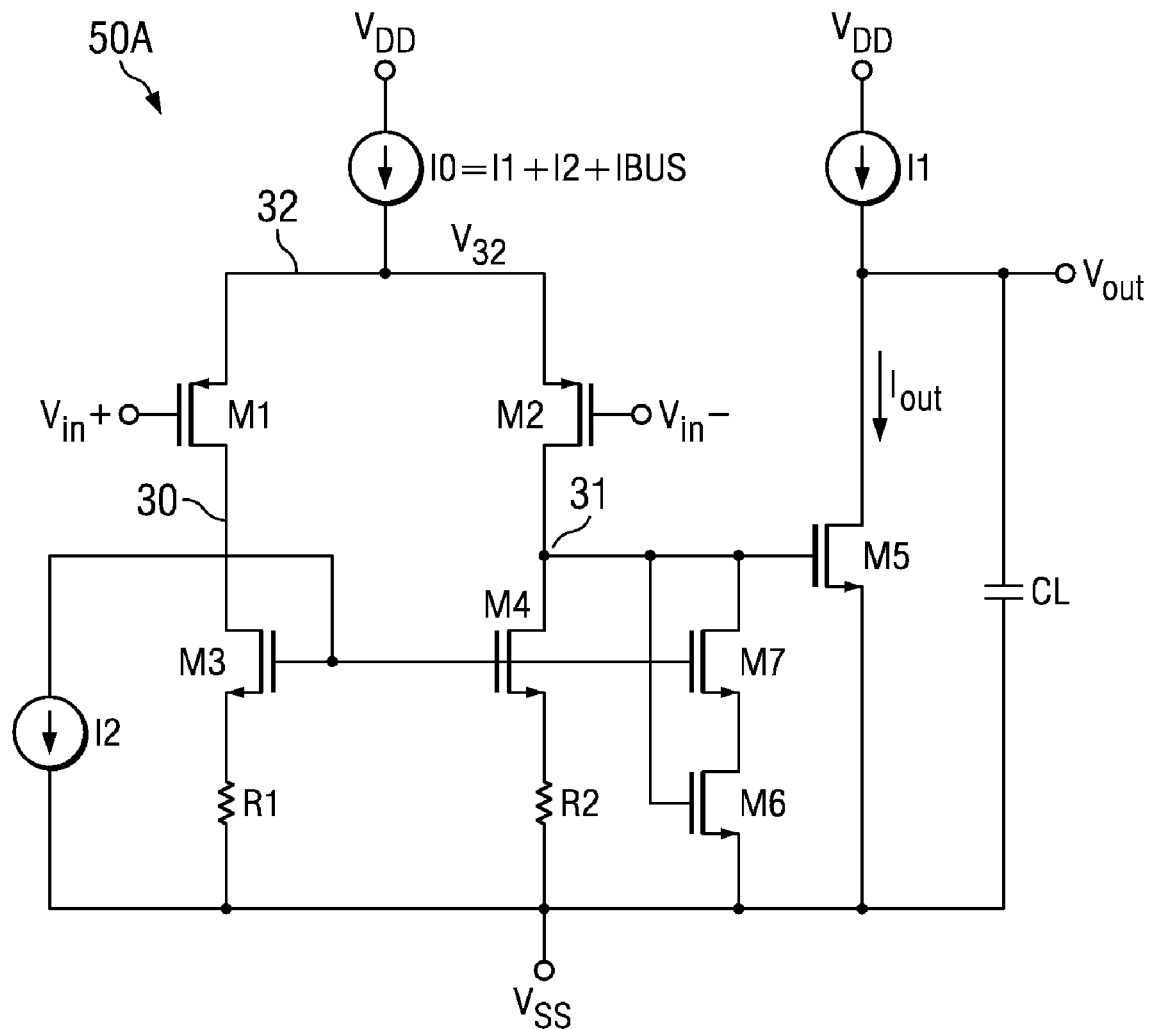
FIG. 10 is a schematic diagram of a simple high slew rate operational amplifier implemented by means of a variable gain amplifier.

FIG. 10 shows a simple variable gain, high slew rate operational amplifier 50A which includes the circuitry of variable gain amplifier 25C in FIG. 9B and further includes a constant current source I1 coupled between $V_{DD}$ and the Vout conductor connected to the drain of amplifying transistor M5. A constant current source I2 is coupled between conductor 30 and $V_{SS}$. The value of the constant current source I0 is equal to I1+I2+IBIAS, where IBIAS is a suitable bias current for the differential input stage including input transistors M1 and M2. For completely balanced circuit operation is necessary to add the current source I2 between conductor 30 and $V_{SS}$, because the current of transistor M2 is split between transistors M4 and M6. To make the circuit operation completely symmetrical, the current through transistor M6 needs to be equal to I1, provided that transistors M5 and M6 are closely matched, because in order to make circuit operation symmetrical, it is necessary to add the same amount of current which flows from conductor 30 to $V_{SS}$. Accordingly, it is necessary to increase the value of I0 to the value I2+I1 plus the suitable amount of bias current IBIAS to provide biasing for the circuitry.

Figure 11:
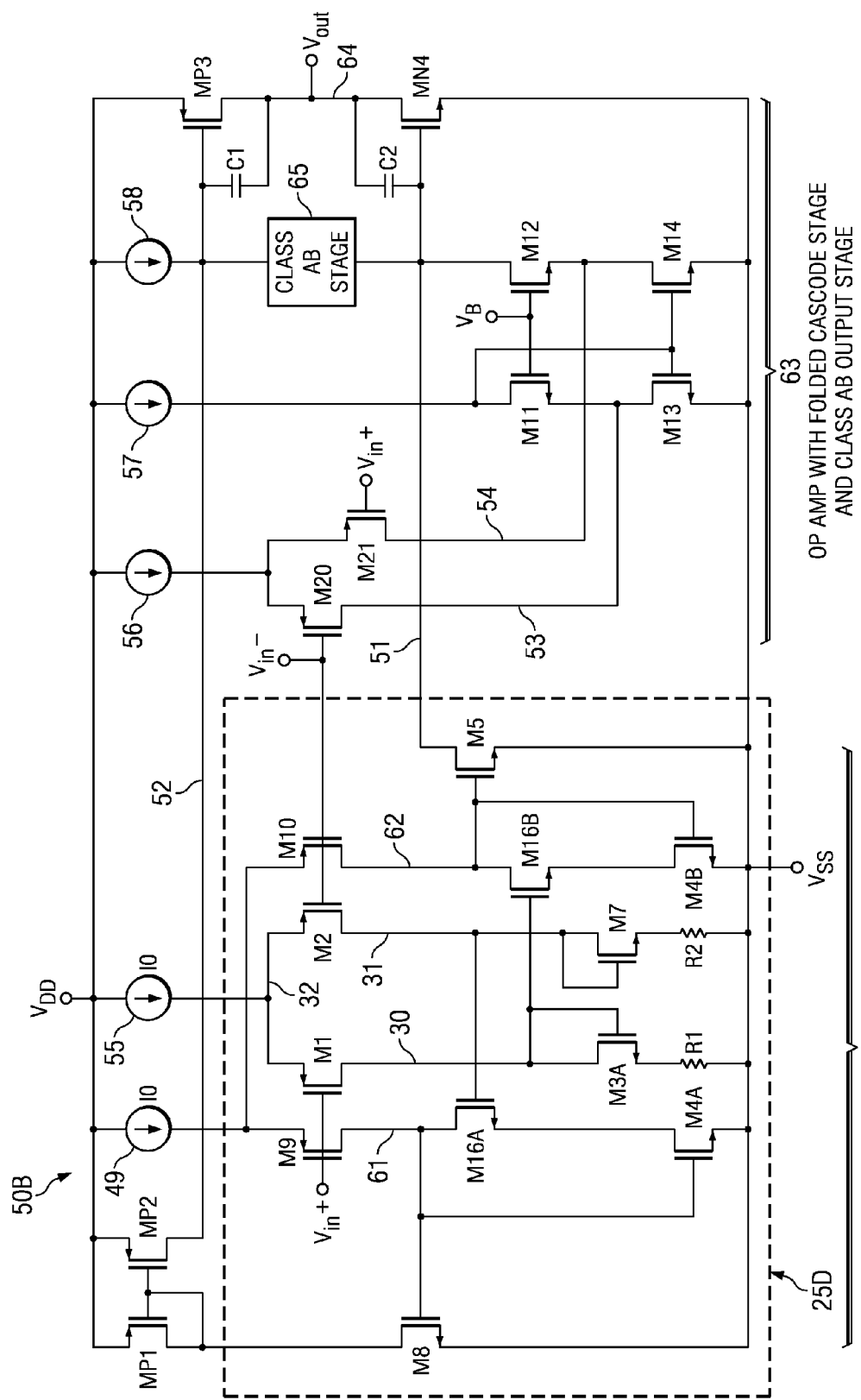
FIG. 11 is a schematic diagram of another high slew rate operational amplifier implemented by means of a variable gain amplifier.

FIG. 11 shows a high slew rate operational amplifier 50B which includes a conventional operational amplifier 63 including a differential input stage including source-coupled P-channel transistors M20 and M21, the drains of which are coupled by conductors 53 and 54, respectively, to the inputs of a folded cascode stage. The folded cascode stage includes N-channel cascode transistors M11 and M12 and N-channel transistors M13 and M14. The gates of input transistors M20 and M21 are coupled to Vin+ and Vin−, respectively. The folded cascode stage also includes current source 57 coupled between $V_{DD}$ and the drain of transistor M11. The gates of cascode transistors M11 and M12 are connected to a bias voltage VB. The source of transistor M11 is connected by conductor 53 to the drain of transistor M13, the source of which is connected to $V_{SS}$. The source of cascode transistor M12 is connected by conductor 54 to the drain of transistor M14, the source of which is connected to $V_{SS}$. The gates of transistors M13 and M14 are connected to the drain of cascode transistor M11. The drain of transistor M12 is connected by conductor 51 to the gate of a N-channel output transistor MN4, the drain of which is coupled by a conductor 64 to Vout and to the drain of a P-channel output transistor MP3 having its source connected to $V_{DD}$ and its gate connected to conductor 52. A conventional class AB control circuit 65 is coupled between conductors 51 and 52.

In accordance with the present invention, the variable gain slew boost stage 67 in FIG. 11, which can be substantially the same as variable gain amplifier 25D of FIG. 9B, superimposes slew boost signals on the gates of output transistors MP3 and MN4 of conventional operational amplifier 63 by means of conductors 51 and 52, respectively.

In variable gain slew boost stage 67, the source of amplifying transistor M8 is connected to $V_{SS}$ and its drain is connected to the gate and drain of a P-channel current mirror input transistor MP1 having its source connected to $V_{DD}$. The drain of transistor MP1 also is connected to the gate of a P-channel current mirror output transistor MP2 having its source connected to $V_{DD}$ and its drain connected to the gate of output transistor MP3 by means of conductor 52.

Thus, variable gain slew boost stage 67 includes two differential stages in parallel, specifically the differential input stage including input transistors M1 and M2 and the differential input stage including input transistors M9 and M10. In normal (non-slewing) operation, Vin+ and Vin− are nearly equal, and during slewing operation they are different by a relatively large voltage magnitude. During normal operation, the currents through transistors M1 and M2 are essentially equal, so the voltages across equal resistors R1 and R2 are essentially equal. The mirrored currents in transistors M16A and M16B are essentially equal, and the currents through transistors M9 and M10 flow through and produce equal voltages across transistors M4A and M4B. Therefore the currents through amplifying transistors M5 and M8 also are equal. The circuitry has very low gain because of the current mirror formed by transistor M3A, resistor R1, and transistors M16B and M4B and also because of the other current mirror formed by transistor M7, resistor R2, and transistors M16A and M4B.

During slewing operation caused by a large magnitude differential input signal, the voltage drop across resistor R1 or R2 decreases and accordingly the voltage of the gate of transistor M16A or transistor M16B decreases. That in effect disconnects diode-connected transistor M4A or M4B, and that causes the current in amplifying transistor M5 or M8 to be relatively unlimited. The relatively unlimited current of amplifying transistor M5 or M8 goes to the high-impedance gate of N-channel output transistor MN4 or P-channel output transistor MP3 and thereby provides fast, symmetrical slewing and settling operation.

The operation of conventional operational amplifier section 63 in response to the differential input signal Vin+−Vin− between the gates of input transistors M20 and M21 is entirely straightforward. The operation of variable gain slew boost stage 67 in response to the differential input signal Vin+−Vin− is superimposed on the gates of output transistors MP3 and MN4 in conventional operational amplifier section 63 during slewing operation to thereby provide very fast slew rates and very fast settling without undue complexity, power consumption, or cost.

The variable gain amplifiers of the present invention thus can be utilized to provide improved transient response in various circuits, including operational amplifiers having high slew rates and LDO voltage regulators.

While the invention has been described with reference to several particular embodiments thereof, those skilled in the art will be able to make various modifications to the described embodiments of the invention without departing from its true spirit and scope. It is intended that all elements or steps which are insubstantially different from those recited in the claims but perform substantially the same functions, respectively, in substantially the same way to achieve the same result as what is claimed are within the scope of the invention.

What is claimed is:

1. Variable gain circuitry comprising:
a first input transistor having a source coupled to receive a first current from a first conductor, a gate coupled to receive a first input voltage, and a drain coupled to a second conductor;
a first current mirror having an input coupled to the second conductor to receive a second current having a value corresponding to a value of the first input voltage relative to a second voltage, the first current mirror also having an output coupled to a current source by means of a third conductor;
a first amplifying transistor having a gate coupled to the third conductor, a source coupled to a first supply voltage, and a drain coupled to conduct at least a portion of a first output current; and
a first transistor and a resistive element coupled in series between the third conductor and the first supply voltage, the first transistor having a gate coupled to the third conductor.

2. The variable gain circuitry of claim 1 wherein the resistive element is a resistor.

3. The variable gain circuitry of claim 1 wherein the resistive element is a second transistor.

4. The variable gain circuitry of claim 3 wherein the first transistor has a source coupled to the first reference voltage and a drain coupled to a source of the second transistor, and wherein the second transistor has a gate coupled to the second conductor and a drain coupled to the third conductor.

5. The variable gain circuitry of claim 4 including a third transistor having a source coupled to the first conductor, a gate coupled to the gate of the first input transistor, and a drain coupled to the drain of the first amplifying transistor.

6. The variable gain circuitry of claim 4 including a maximum-gain-limiting resistor coupled between the drain of the first transistor and the third conductor.

7. The variable gain circuitry of claim 4 configured to provide slew boost in an operational amplifier which includes an input stage coupled to a folded cascode stage and an output stage coupled to the folded cascode stage, wherein the first input transistor, the first current mirror, the first amplifying transistor, the first transistor and the resistive element provide slew boost on a gate of a first output transistor of the output stage.

8. The variable gain circuitry of claim 7 further including a second current mirror having an input coupled to the second conductor to receive a third current having the value corresponding to the value of the first input voltage relative to the second input voltage, the second current mirror also having an output coupled to a gate of a second amplifying transistor having a drain coupled by means of a third current mirror to provide slew boost on a gate of a second output transistor of the output stage.

9. The variable gain circuitry of claim 5 configured as a voltage regulator including:
 a differential input stage including a first input coupled to receive a reference voltage, a second input coupled to a regulated output conductor of the voltage regulator, and an output, and
 an output stage for producing a regulated output voltage on the regulated output conductor, including a first output transistor having a source coupled to a second supply voltage and a drain coupled to the regulated output conductor, a second output transistor having a source coupled to the first supply voltage and a drain coupled to the regulated output conductor, and a cascode transistor having a source coupled to a gate of the second output transistor and a drain coupled to a gate of the first output transistor,
 wherein the first input transistor, the first current mirror, the first amplifying transistor, the first transistor and the resistive element function as an error amplifier, and wherein the gates of the first input transistor and the third transistor are coupled to the output of the differential input stage and the drains of the first amplifying transistor and the third transistor are coupled by a fourth conductor to the gate of the second output transistor.

10. The variable gain circuitry of claim 1 wherein the current source is a constant current source.

11. The variable gain circuitry of claim 4 wherein the current source includes a second input transistor having a source coupled by the first conductor to the source of the first input transistor, a gate coupled to a second input voltage, and a drain coupled to the third conductor.

12. The variable gain circuitry of claim 1 wherein the first current mirror has an input coupled to the second conductor to receive the second current having the value corresponding to the value of the first input voltage relative to the second voltage, the first current mirror also having an output coupled to a gate of the first amplifying transistor, the first amplifying transistor having a drain coupled to conduct at least a portion of a first output current, the variable gain circuitry also including a second current mirror which has an input coupled to the second conductor to receive a third current having a value corresponding to a value of the first input voltage relative to the second voltage, the second current mirror having an output coupled to a gate of a second amplifying transistor having a drain coupled to conduct at least a portion of a second output current.

13. The variable gain circuitry of claim 9 wherein the output stage is a class AB output stage.

14. The variable gain circuitry of claim 5 wherein the first input transistor and the third transistor are P-channel transistors and wherein the first current mirror is composed of N-channel transistors.

15. The variable gain circuitry of claim 9 including a resistive pull-up element coupled between the gate of the first output transistor and the second supply voltage, a cascode transistor having a drain coupled to the gate of the first output transistor, a source coupled to the gate of the first output transistor, and a gate coupled to a bias voltage.

16. A method of operating an amplifier to provide variable amplifier gain, the method comprising:
 providing a first input transistor having a source coupled to receive a first current from a first conductor, a gate coupled to receive a first input voltage, and a drain coupled to a second conductor;
 coupling an input of a first current mirror to the second conductor to receive a second current having a value corresponding to a value of the first input voltage relative to a second input voltage;
 coupling an output of the first current mirror to a current source by means of a third conductor;
 coupling a gate of an amplifying transistor to the third conductor, coupling a source of the amplifying transistor to a first reference voltage, and coupling a drain of the amplifying transistor to conduct at least a portion of an output current; and
 coupling a first transistor and a resistive element in series between the third conductor and the first reference voltage, the first transistor having a gate coupled to the third conductor to produce a nonlinear relationship between currents of the first transistor and the amplifying transistor.

17. The method of claim 16 including coupling a source of a third transistor having a source to the first conductor, coupling a gate of the third transistor to the gate of the first input transistor, and coupling a drain of the third transistor to the drain of the amplifying transistor.

18. The method of claim 16 including controlling the slewing of an operational amplifier including a differential input stage receiving a differential input signal equal to the difference between the first and second input voltages and an output stage, the output stage including a first output transistor and a second output transistor each having a gate coupled to an output, respectively, of the differential input stage, by superimposing an output signal produced in response to operation of the amplifying transistor onto a gate of one of the output transistors.

19. The method of claim 17 including:
 controlling the accuracy of a regulated output voltage produced by a voltage regulator by applying the regulated output voltage to a feedback input of a differential input stage having a reference voltage applied to a reference input of the differential input stage and applying an output of the differential input stage to a control electrode of the third transistor having a first electrode coupled to an input of an output stage which generates the regulated output voltage on an output conductor;
 producing a decrease in the value of the regulated output voltage in response to a step increase in load current demand by a load coupled to the output conductor; and
 supplying the load current demanded by the load by applying the decreased value of the regulated output voltage during the decrease in value to a first electrode of the first input transistor having its gate coupled to the output of the differential input stage to decrease current in a first current mirror having an output coupled to a current source and to a control electrode of an amplifying transistor, causing the current source to rapidly turn on the amplifying transistor to cause it to rapidly turn on a cascode transistor of the output stage, and turning on a first output transistor of the output stage in response to current produced by the cascode transistor.

20. Variable gain circuitry for producing a limited current in response to a value of an input signal having a magnitude significantly less than a predetermined value and a relatively unlimited current in response to a value of the input signal significantly greater than the predetermined value, the variable gain circuitry comprising:

a first input transistor having a source coupled to receive a first current from a first conductor, a gate coupled to receive a first input voltage, and a drain coupled to a second conductor;

means for coupling an input of a first current mirror to the second conductor to receive a second current having a value corresponding to a value of the first input voltage relative to a second input voltage;

means for coupling an output of the first current mirror to a current source;

means for coupling a gate of an amplifying transistor to a third conductor, coupling a source of the amplifying transistor to a first reference voltage, and coupling a drain of the amplifying transistor to conduct at least a portion of an output current; and means for coupling a first transistor and a resistive element in series between the third conductor and the first reference voltage, the first transistor having a gate coupled to the third conductor to produce a nonlinear relationship between currents of the first transistor and the amplifying transistor.

* * * * *